(12) United States Patent
Chang et al.

(10) Patent No.: US 6,404,033 B1
(45) Date of Patent: Jun. 11, 2002

(54) SCHOTTKY DIODE HAVING INCREASED ACTIVE SURFACE AREA WITH IMPROVED REVERSE BIAS CHARACTERISTICS AND METHOD OF FABRICATION

(75) Inventors: Paul Chang, Saratoga; Geeng-Chuan Chern, Cupertino; Wayne Y. W. Hsueh, San Jose; Vladimir Rodov, Redondo Beach, all of CA (US)

(73) Assignee: APD Semiconductor, Inc., San Jose, CA (US)

( * ) Notice: Subject to any disclaimer, the term of this patent is extended or adjusted under 35 U.S.C. 154(b) by 0 days.

(21) Appl. No.: 09/620,653

(22) Filed: Jul. 20, 2000

Related U.S. Application Data

(63) Continuation-in-part of application No. 09/283,537, filed on Apr. 1, 1999, now Pat. No. 6,331,445, and a continuation-in-part of application No. 09/620,074, filed on Jul. 20, 2000.

(51) Int. Cl.[7] .................. H01L 27/095; H01L 29/47; H01L 29/812; H01L 31/07; H01L 31/108
(52) U.S. Cl. ................. 257/484; 257/471; 257/622
(58) Field of Search ................... 257/483, 484, 257/622, 623, 624, 471

(56) References Cited

U.S. PATENT DOCUMENTS

| | | |
|---|---|---|
| 4,713,358 A | 12/1987 | Bulat |
| 4,926,233 A | 5/1990 | Hutter |
| 4,982,260 A | 1/1991 | Chang et al. |
| 5,262,669 A * | 11/1993 | Wakatabe et al. ........... 257/483 |
| 5,612,232 A | 3/1997 | Thero et al. |
| 5,696,025 A * | 12/1997 | Violette et al. ............. 437/175 |
| 6,232,165 B1 | 5/2001 | Wong |

FOREIGN PATENT DOCUMENTS

| | | | |
|---|---|---|---|
| JP | 02000031505 * | 1/2000 | ......... H01L/29/872 |

* cited by examiner

Primary Examiner—Richard Elms
Assistant Examiner—Brad Smith
(74) Attorney, Agent, or Firm—Townsend and Townsend and Crew LLP; Henry K. Woodward

(57) ABSTRACT

A Schottky diode comprises a semiconductor body of one conductivity type, the semiconductor body having a grooved surface, a metal layer on the grooved surface and forming a Schottky junction with the semiconductor body. The semiconductor body preferably includes a silicon substrate with the grooved surface being on a device region defined by a guard ring of a conductivity type opposite to the conductivity type of the semiconductor body, and a plurality of doped regions at the bottom of grooves and forming P-N junctions with the semiconductor body. The P-N junctions of the doped regions form carrier depletion regions across and spaced from the grooves to increase the reverse bias breakdown voltage and reduce the reverse bias leakage current.

18 Claims, 12 Drawing Sheets

SCHOTTKY DIODE HAVING INCREASED ACTIVE SURFACE AREA WITH IMPROVED REVERSE BIAS CHARACTERISTICS AND METHOD OF FABRICATION

CROSS-REFERENCES TO RELATED APPLICATIONS

This application is a continuation-in-part of application Ser. No. 09/283,537 filed Apr. 1, 1999 for "Power Rectifier Device" U.S. Pat. No 6,331,445 and pending application Ser. No. 09/620,074 filed Jul. 20, 2000 for "Schottky Diode Having Increased Active Surface Area With Improved Reverse Bias Characteristics And Method Of Fabrication", the descriptions of which are incorporated herein by reference. And a CIP of 09/544,730 filed Apr. 6, 2000.

BACKGROUND OF THE INVENTION

This invention relates generally to power semiconductor devices, and more particularly the invention relates to a Schottky diode device and a method of making same.

Power semiconductor rectifiers have a variety of applications including use in power supplies and power converters. Heretofore, Schottky diodes have been used in these applications. A Schottky diode is characterized by a low turn-on voltage, fast turnoff, and nonconductance when the diode is reverse biased. To create a Schottky diode a metal-silicon barrier must be formed. In order to obtain the proper characteristics for the Schottky diode, the barrier metal is likely different than the metal used in other process steps such as metal ohmic contacts.

Copending application Ser. No. 09/283,537, supra, discloses a vertical semiconductor power rectifier device which employs a large number of parallel connected cells, each comprising a MOSFET structure with a gate-to-drain short via common metalization and an associated Schottky diode. This provides a low Vf path through the channel regions of the MOSFET cells to the source region on the other side of the device. The method of manufacturing the rectifier device provides highly repeatable device characteristics at reduced manufacturing costs.

Copending application Ser. No. 09/620,074 effectively increases diode surface by providing a trenched surface on which Schottky material is deposited. The resulting structure has increased current capacity for semiconductor chip area. In accordance with the method of fabricating the Schottky diode, a guard ring is formed around a device region in a semiconductor chip surface. The guard ring has conductivity type opposite to that of the chip body. Using photoresist masking and etching, a plurality of trenches are etched in the surface of the device region, thereby effectively increasing the active surface area in the device region. A Schottky metal is then deposited over the device region in the trenches, and electrode material is deposited to form top and bottom electrodes for the Schottky diode.

The present invention is directed to an improved method of manufacturing a Schottky rectifier device and the resulting structure.

SUMMARY OF THE INVENTION

In accordance with the invention, the effective surface area of a Schottky diode is increased by providing a trenched surface on which Schottky material is deposited. The resulting structure has increased current capacity for semiconductor chip area. To provide for higher reverse breakdown voltage and lower reverse leakage current, a P-N junction is formed at or near the bottom of the trench surfaces so that when the Schottky diode is reversed biased, a charge depletion region spreads across and spaced from the trench surface, thereby increasing the reverse breakdown voltage and reducing reverse leakage current.

In accordance with a preferred embodiment, the PN junction is formed by ion implantation in alignment with the trench walls. A photoresist mask can be employed to define the ion implanted surface area. Alternatively, an oxide layer can be selectively formed on the surfaces of the trench surface to limit the implantation of ions.

The invention and objects and features thereof will be more readily apparent from the following detailed description and dependent claims when taken with the drawings.

BRIEF DESCRIPTION OF THE DRAWINGS

Like elements in the figures have the same reference numerals.

DETAILED DESCRIPTION OF THE ILLUSTRATIVE EMBODIMENTS

Figure 1:
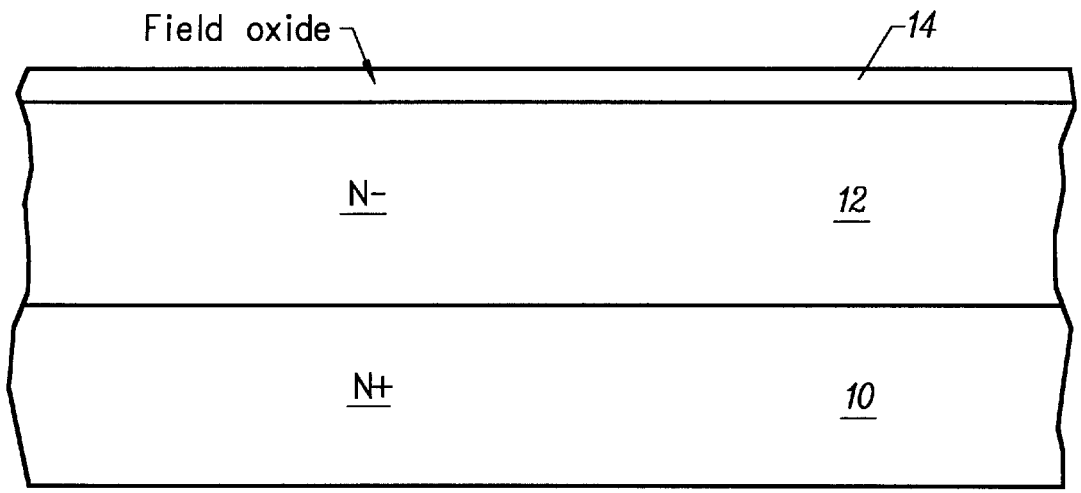
FIGS. 1–10 are section views illustrating steps in fabricating a Schottky diode in accordance with one embodiment of the invention.

FIGS. 1–10 are section views illustrating process steps in fabricating a Schottky diode in accordance with one embodiment of the present invention. In FIG. 1 an N+ silicon substrate 10 has an N– epitaxial silicon layer 12 thereon with layer 12 having a conductivity of about 0.1–10 ohm cm. A field oxide 14 is grown or deposited on the surface of epitaxial layer 12 to a thickness of 300–1000 nm.

Figure 2:
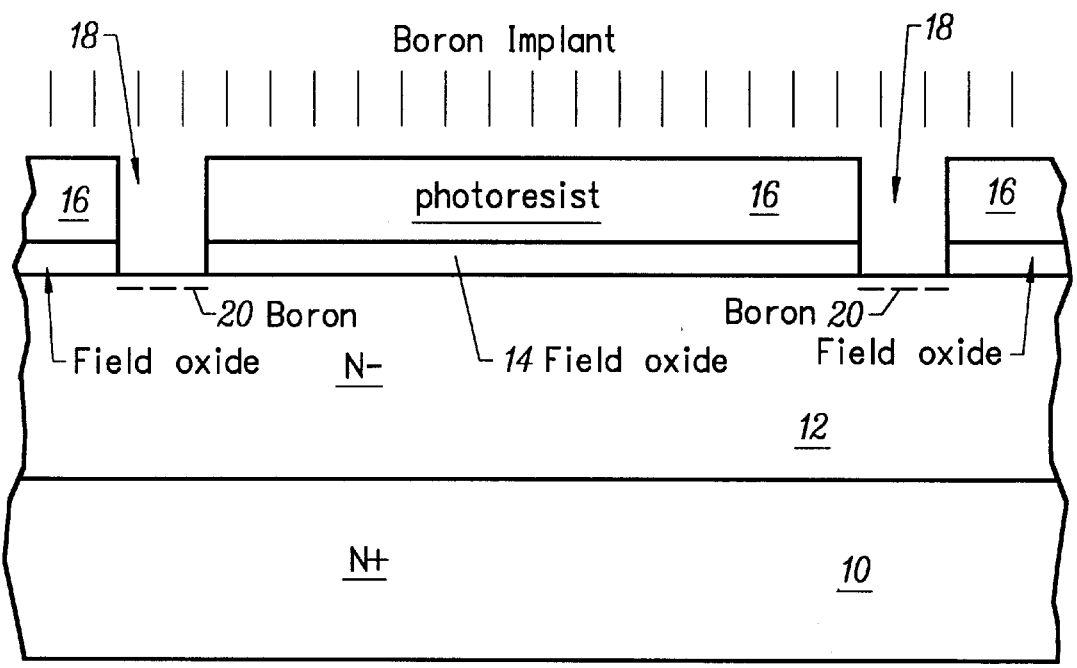

FIG. 2 a photoresist pattern 16 is formed over field oxide 14 with openings through the photoresist at 18 for the removal of exposed field oxide and implantation of boron or other P-type dopant for use in fabricating a guard ring around a device region. Boron is implanted at 20 at a dose of about $10^{11}$–$10^{14}$/cm$^2$. The boron implant can be after photoresist removal.

Figure 3:
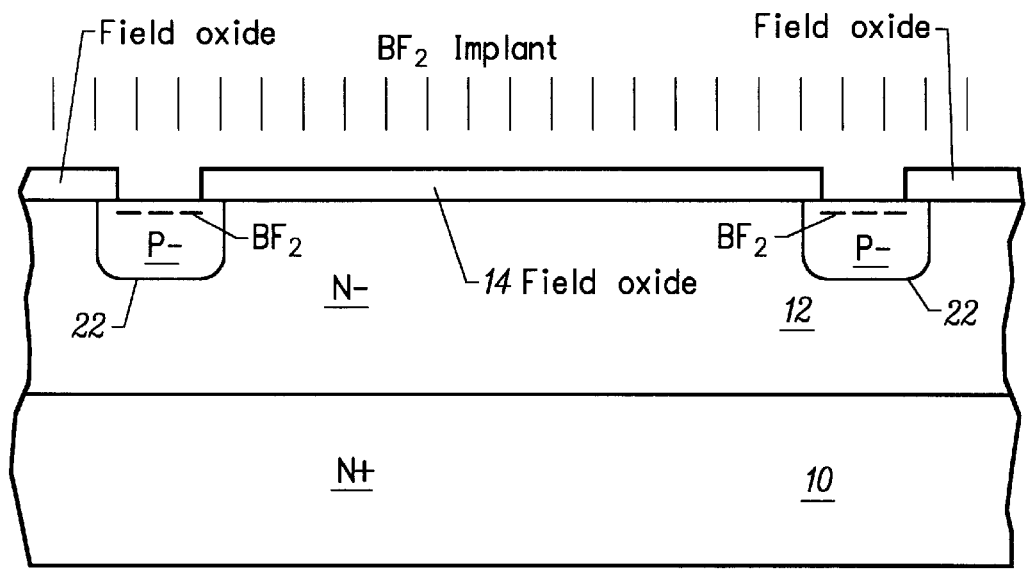

In FIG. 3 the photoresist 16 is removed and the body is heated for boron drive-in in forming deep P-regions 22 which are the guard ring surrounding a device region under field oxide 14. An additional boron (BF$_2$) implant is made for high surface concentration to form good ohmic contacts to the guard ring. Rapid thermal annealing is employed to activate the BF$_2$ dopant.

Figure 4:
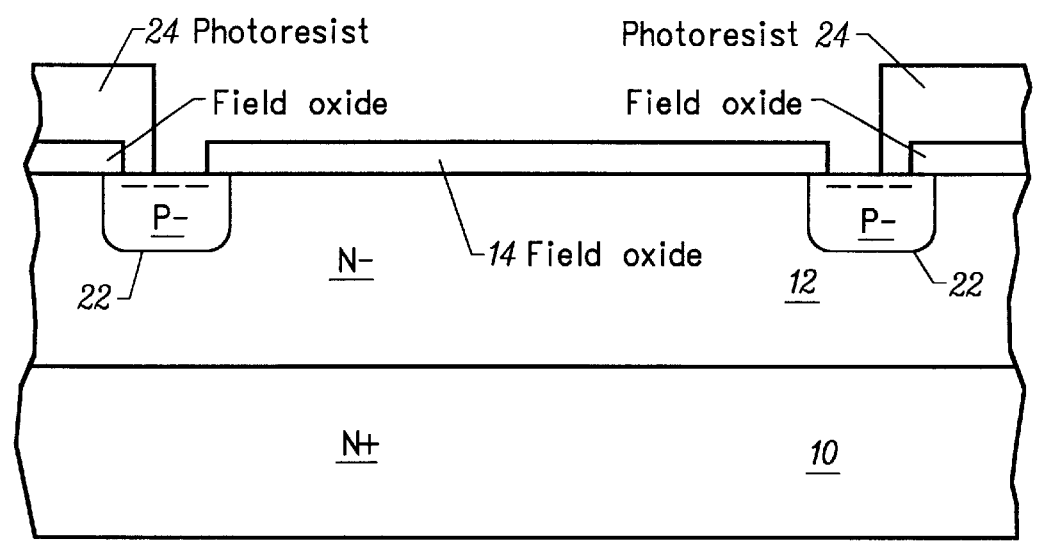
Figure 5:
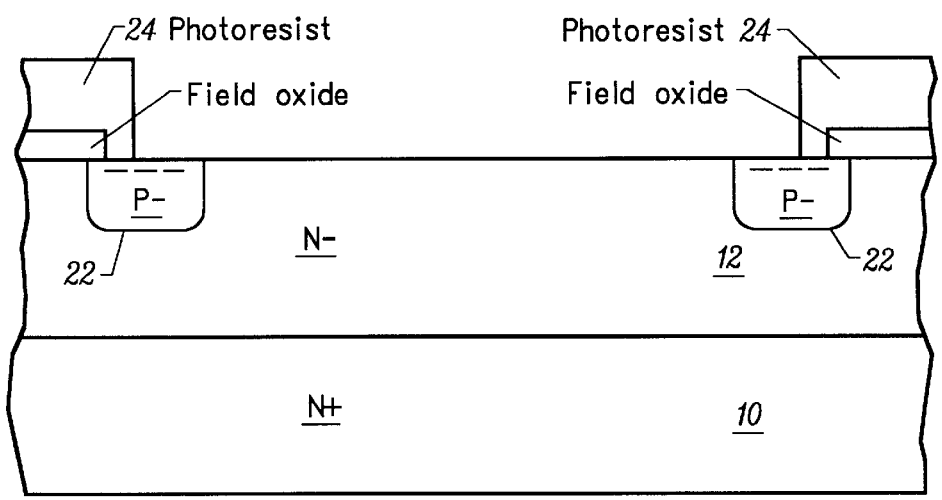

In FIG. 4 a second photoresist mask pattern 24 is used to expose the active device region so that the overlying field oxide 14 can be later removed, as shown in FIG. 5 in which a suitable oxide etchant such as HF solution is employed.

Figure 6:
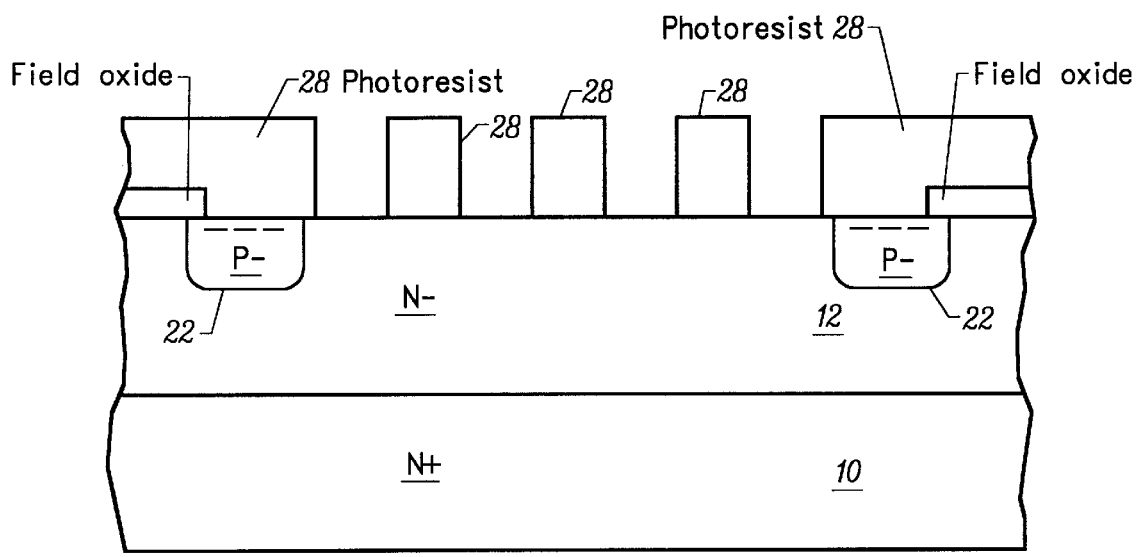
Figure 7:
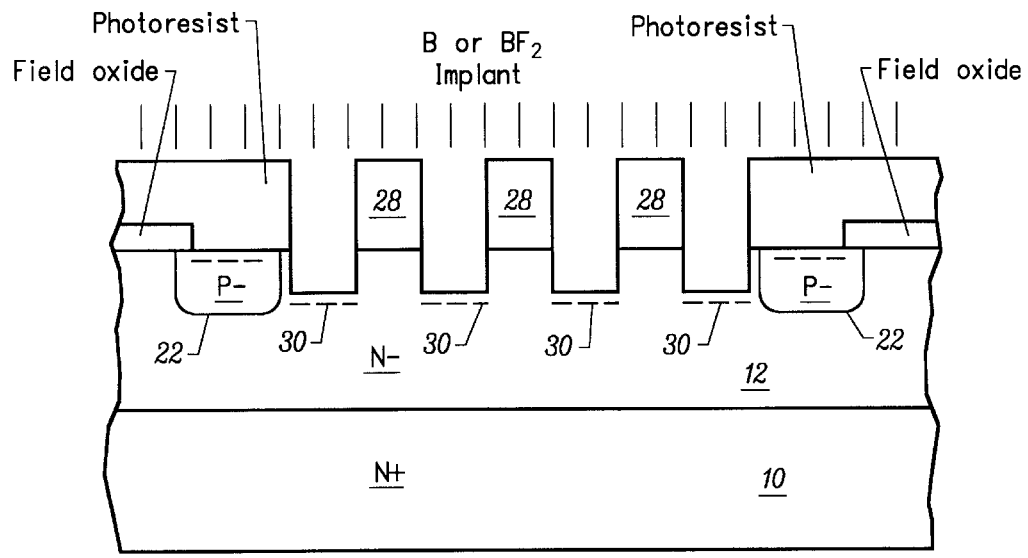

Thereafter, in FIG. 6 a third photoresist pattern 28 is formed over the surface of the active region to define trenches in the surface of the active region by etching as illustrated in FIG. 7. A plasma or reactive ion etch can be employed for etching the trenches with either vertical or sloped sidewalls. Thereafter, boron or BF$_2$ ions are implanted in the bottom of the trenches in surface areas 30 of epitaxial layer 12 using photoresist pattern 28 as an ion implant mask.

Figure 8:
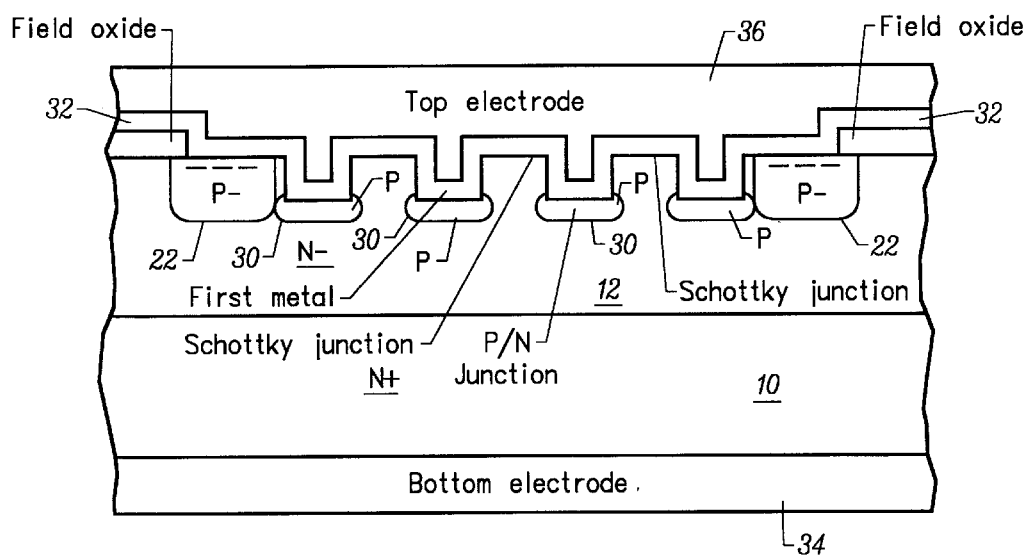

Photoresist pattern 28 is then removed and rapid thermal annealing is employed to form P-regions 30 at the trench bottoms, thereby forming P-N junctions with epitaxial layer 12. A Schottky metal 32 is then deposited over the surface of the active region in the trenches as shown in FIG. 8. The Schottky metal may comprise molybdenum, aluminum, platinum or other known material for forming Schottky junctions with silicon such as refractory metals and silicides thereof. Finally, a bottom electrode 34 and a top electrode 36 are deposited for making contact to the finished Schottky diode. The electrode material can be titanium, titanium nitride, nickel, silver, gold, copper, or other suitable material and combinations thereof.

Figure 9:
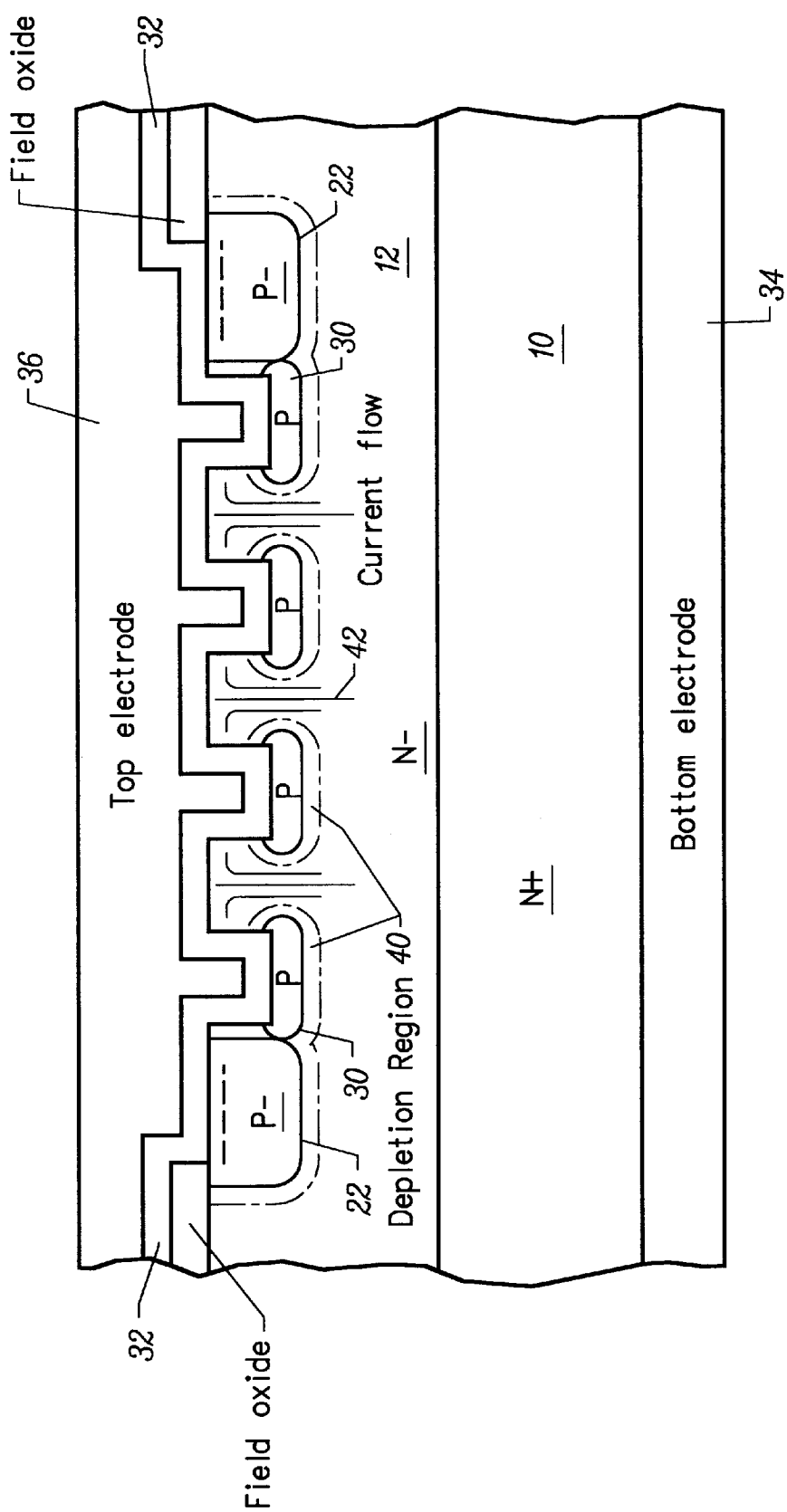

FIG. 9 illustrates the finished device with a forward bias and depletion regions 40 around P-regions 30 and the PN-junction formed with N– epitaxial layer 12. With a forward bias, current flows from the top electrode to the bottom electrode as. illustrated at 42.

Figure 10:
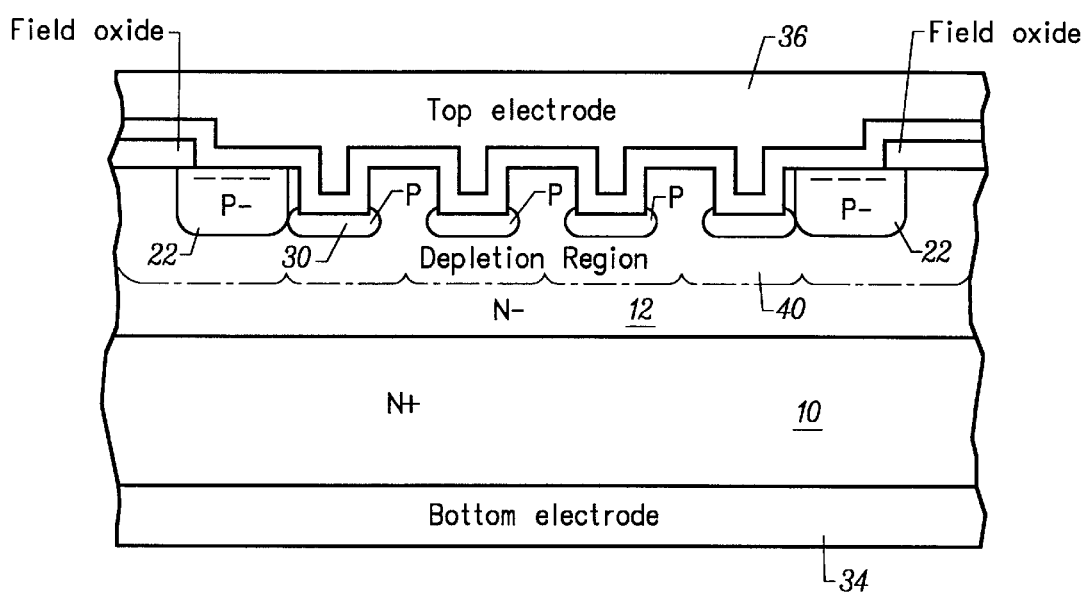

FIG. 10 illustrates the finished device with a reverse bias applied to the top of electrode 36 and bottom electrode 34, whereby current ceases to flow. The reverse bias on the PN-junction formed by P-regions 30, and the N– epitaxial layer 12 expands across and spaced from the Schottky diode as shown at 40. The increased charge depletion region with the reverse bias of the electrodes increases the reverse breakdown voltage for the device and lowers reverse leakage current.

Figure 11:
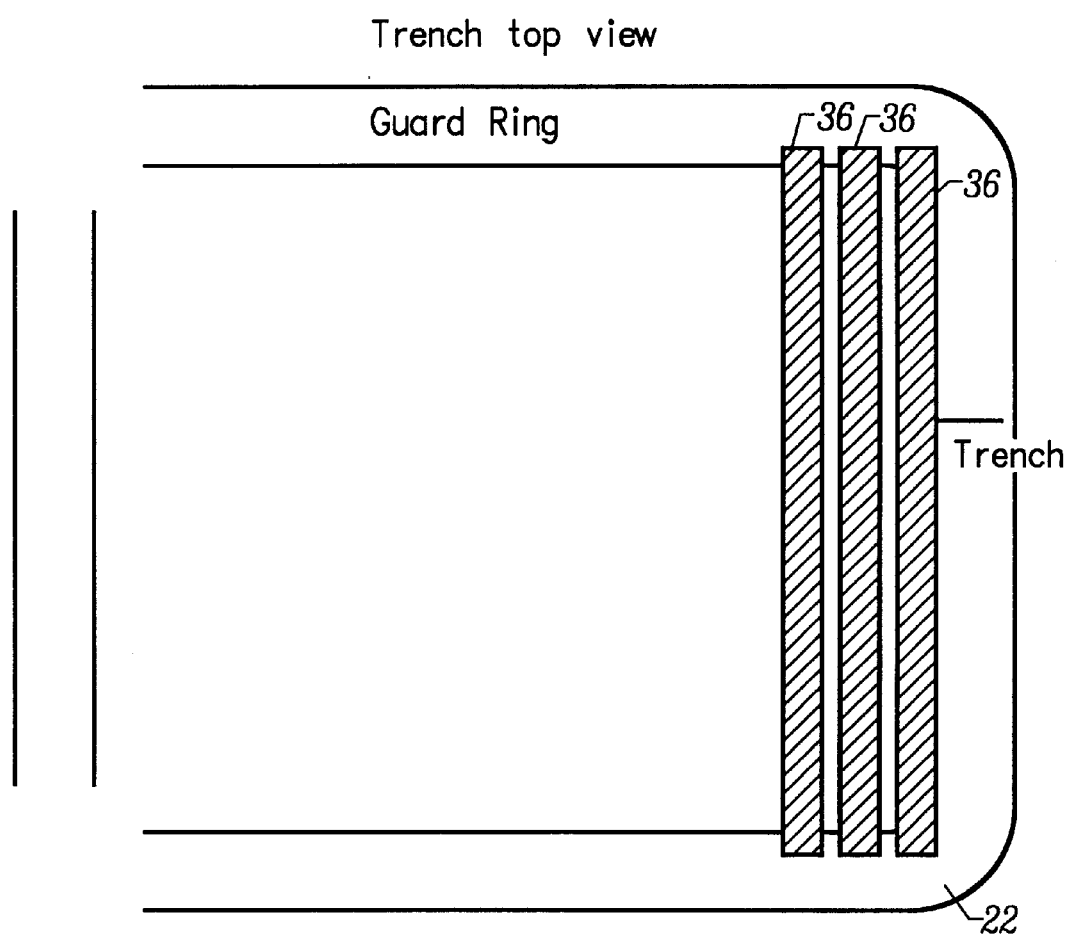
FIG. 11 is a plan view of the resulting Schottky diode using the processes of FIGS. 1–10.
Figure 12:
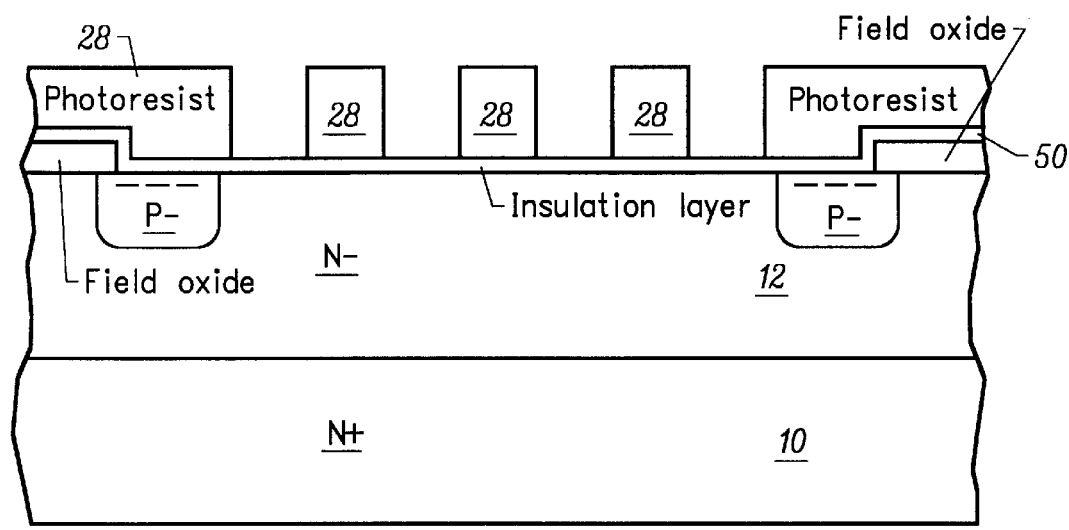
FIGS. 12–18 are section views illustrating steps in fabricating a Schottky diode in accordance with another embodiment of the invention.

FIG. 11 is a plan view illustrating the top of the completed Schottky diode. The trenched surface in the active region surrounded by guard ring 22 increases the surface area of the Schottky diode and this increases current density and current carrying capacity for unit surface area of the semiconductor device.

As shown in FIG. 7, some of the boron or $BF_2$ can be implanted into the sidewalls of the trenches, especially when the sidewalls are sloped. To prevent this an alternative embodiment is provided.

Figure 13:
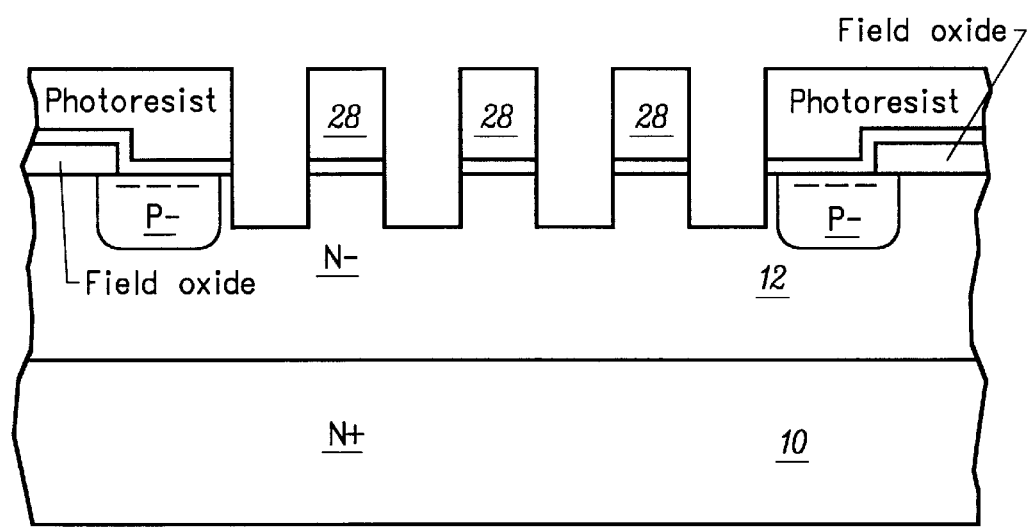

FIGS. 12–18 are section views illustrating the alternative embodiment of the invention. In this process, the steps illustrated in FIGS. 1–5 remain the same. However, in FIG. 12, an insulator layer 50 having a thickness on the order of 30–300 nm is grown or deposited on the surface of epitaxial layer 12. The insulator is preferably silicon oxide or a silicon nitride layer. Thereafter, photoresist pattern 28 is again formed over the surface of the active region to define trenches in the surface of the active region by etching as illustrated in FIG. 13. Again, a plasma or reactive ion etch can be employed to form the trenches with either vertical or sloped sidewalls. Insulator 50 is removed prior to trench formation using either a wet or dry etch.

Figure 14:
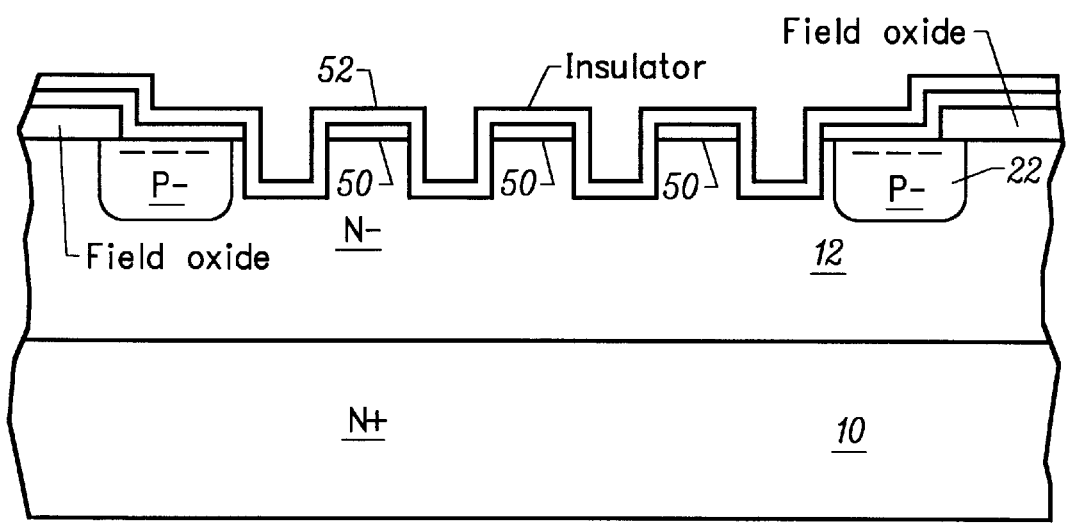

Next, as shown in FIG. 14, the photoresist 28 is removed, and another insulator layer 52 is deposited over the surface of the device. The insulator can be silicon oxide or silicon nitride and is preferably in the range of 30 to 300 nm in thickness.

Figure 15:
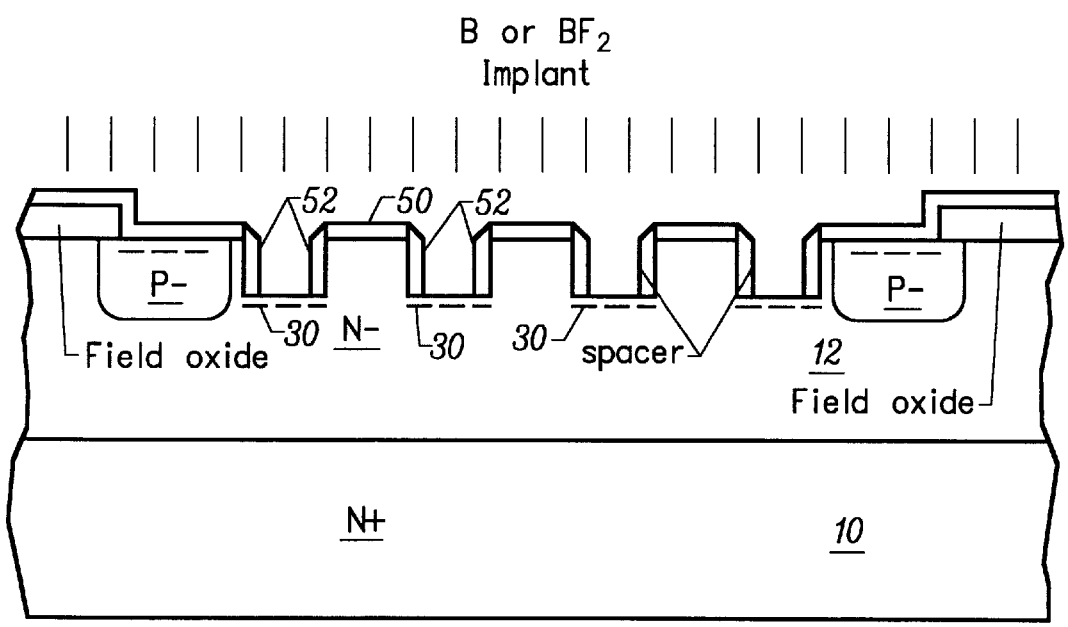
Figure 16:
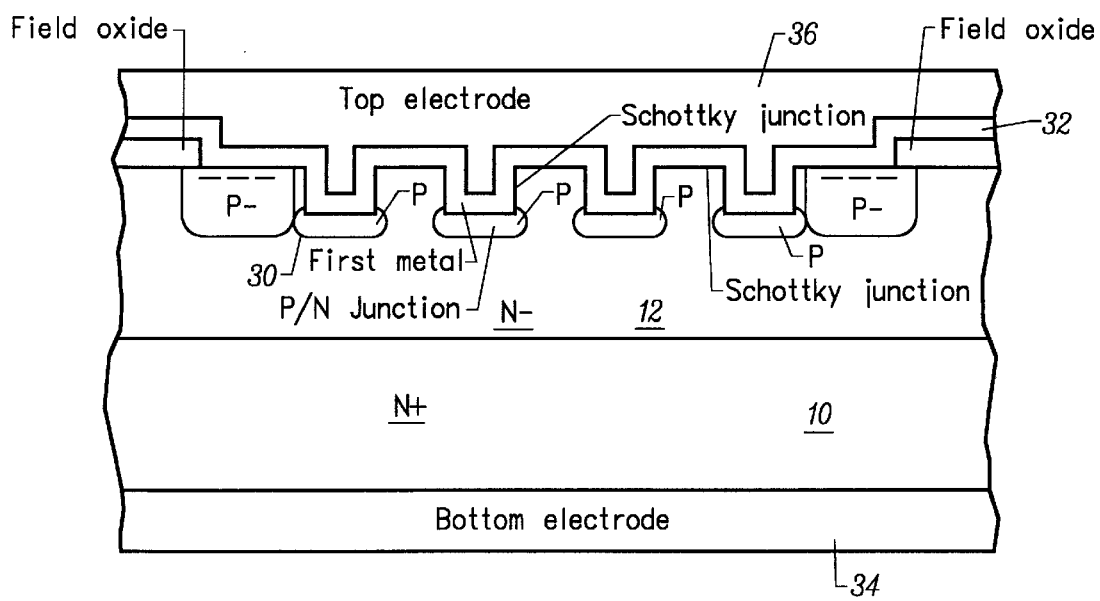
Figure 17:
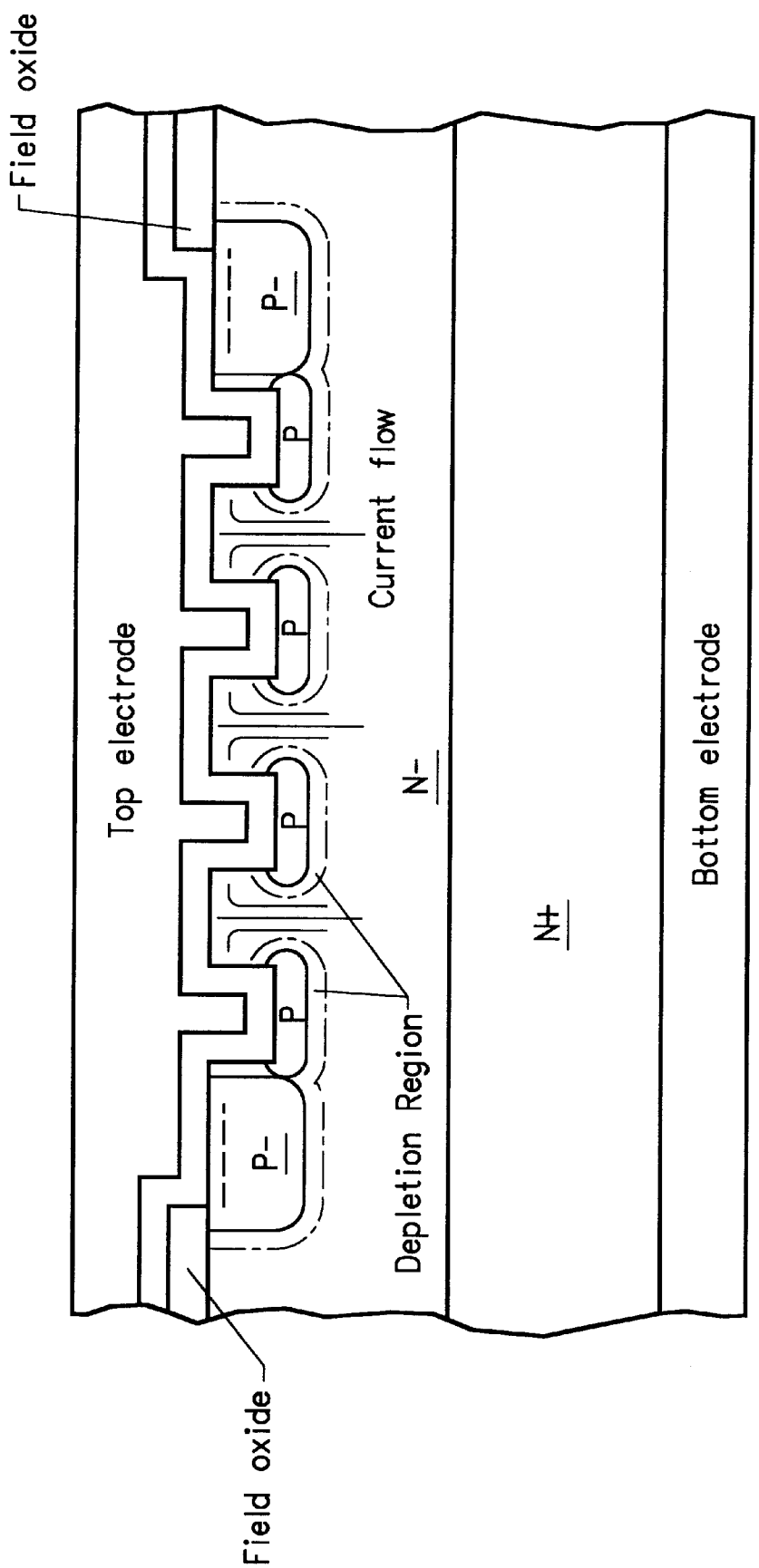

Next, as shown in FIG. 15, anisotropic etch is used to remove the insulator 52 from the bottom of the trenches but leaves insulator on the sidewalls and on the top of the trench surfaces, and boron or $BF_2$ is then implanted into the bottom of the trenches in surface areas 30 of epitaxial layer 12. This is similar to the process step of FIG. 7. The sidewall spacer also reduces the bottom trench area, thereby reducing the PN-junction area and increasing the Schottky conducting area. Thereafter, as shown in FIG. 16, rapid thermal annealing is employed to form P-regions 30 at the trench bottoms, and then the insulator 50, 52 is removed from the walls of the trench. Schottky metal 32 is then deposited over the surface of the trenched surface, similar to the process step of FIG. 8, followed by forming of bottom electrode 34 and top electrode 36. Use of the oxide ion mask, as shown in FIG. 14. provides added protection against ion implantation into the sidewalls and top surfaces of the trenched surface.

Figure 18:
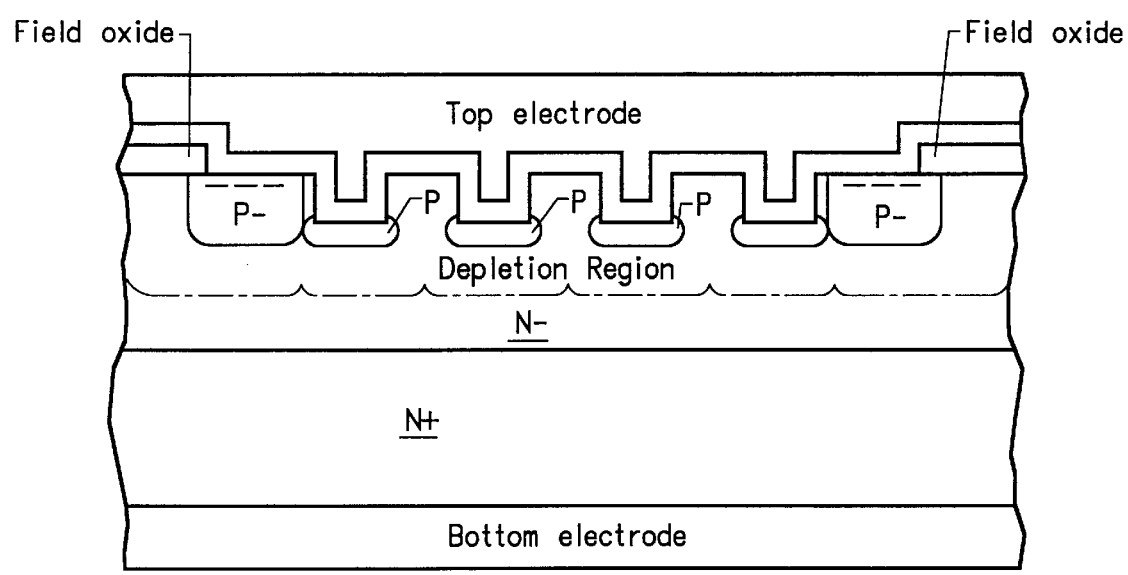

Finally, the finished device is shown forward biased in FIG. 1 and reverse biased in FIG. 18, similar to FIGS. 9 and 10, above.

There has been shown an improved Schottky diode having increased current capacity for semiconductor chip area. The inclusion of PN-junctions at the bottoms of the trenched surface permits the use of enhanced depletion regions when the diode is reversed biased, thereby increasing the reverse bias breakdown voltage, and reducing reverse bias leakage current. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A Schottky diode comprising:
   a) a semiconductor body of one conductivity type and having a major surface,
   b) a guard ring of opposite conductivity type formed in the major surface of second conductivity type and surrounding a device region,
   c) a plurality of trenches in the major surface within the device region,
   d) doped regions of said opposite conductivity type formed in the semiconductor body at the bottom of trenches, said doped region forming P-N junctions with the semiconductor body, and
   e) a metal overlying the device region and in the plurality of trenches forming a Schottky junction with all top surfaces and side walls of the trenches in the semiconductor body.

2. The semiconductor body of claim 1 wherein the semiconductor body is silicon.

3. The semiconductor body of claim 2 wherein the semiconductor body comprises a substrate and an epitaxial layer, the epitaxial layer being of N-conductivity.

4. A Schottky diode comprising:
   a) a silicon semiconductor body of one conductivity type and having a major surface, said silicon semiconductor body comprising a substrate and an epitaxial layer, the epitaxial layer being of N-conductivity;
   b) a guard ring of P-type conductivity type formed in the major surface of second conductivity type and surrounding a device region,
   c) a plurality of trenches in the major surface within the device region,
   d) doped regions of said opposite conductivity type formed in the semiconductor body at the bottom of trenches, said doped region forming P-N junctions with the semiconductor body, and
   e) a metal overlying the device region and in the plurality of trenches forming a Schottky junction with the semiconductor body.

5. The semiconductor body of claim 4 wherein the metal overlying the device region is selected from the group consisting of molybdenum, platinum, aluminum, refractory metal and suicides thereof.

6. The semiconductor body of claim 5 and further including contact metal on the bottom of the semiconductor body and on the metal overlying the device region.

7. The semiconductor body of claim 6 wherein the contact metal is selected from the group consisting of Ti, TiN, Ni, Ag, Au, Cu, and combinations thereof.

8. The semiconductor body of claim 4 and further including contact metal on the bottom of the semiconductor body and on the metal overlying the device region.

9. The semiconductor body of claim 8 wherein the contact metal is selected from the group consisting of Ti, TiN, Ni, Ag, Au, Cu, and combinations thereof.

10. A Schottky diode comprising a semiconductor body of one conductivity type, the semiconductor body having a grooved surface, a metal layer on the grooved surface and forming a Schottky junction with all top surfaces and side walls of the grooved surface of the semiconductor body, the grooved surface being on a device region of the semiconductor body defined by a guard ring of a second conductivity type surrounding the device region; and a plurality of doped regions of opposite conductivity type in the semiconductor body at the bottom of trenches, the doped regions forming P-N junctions with the semiconductor body.

11. The Schottky diode as defined by claim 10 wherein the semiconductor body comprises a silicon substrate and an epitaxial silicon layer of N-conductivity on the substrate, the epitaxial layer having the grooved surface.

12. The Schottky diode as defined by claim 11 wherein the metal layer is selected from the group consisting of molybdenum, platinum, aluminum, refracting metal, silicides thereof, and combinations thereof.

13. The semiconductor body for claim 3 wherein the guard ring is P-type conductivity.

14. The semiconductor body of claim 13 wherein the metal overlying the device region is selected from the group consisting of molybdenum, platinum, aluminum, refractory metal and silicides thereof.

15. The semiconductor body of claim 14 and further including contact metal on the bottom of the semiconductor body and on the metal overlying the device region.

16. The semiconductor body of claim 15 wherein the contact metal is selected from the group consisting of Ti, TiN, Ni, Ag, Au, Cu, and combinations thereof.

17. The semiconductor body of claim 1 and further including contact metal on the bottom of the semiconductor body and on the metal overlying the device region.

18. The semiconductor body of claim 17 wherein the contact metal is selected from the group consisting of Ti, TiN, Ni, Ag, Au, Cu, and combinations thereof.

* * * * *

UNITED STATES PATENT AND TRADEMARK OFFICE
CERTIFICATE OF CORRECTION

PATENT NO.   : 6,404,033 B1                                                      Page 1 of 1
DATED        : June 11, 2002
INVENTOR(S)  : Paul Chang, Geeng-Chuan Chern, Wayne Y. W. Hsueh and Vladimir Rodov It is certified that error appears in the above-identified patent and that said Letters Patent is hereby corrected as shown below:

Column 4,
Lines 38 and 40, change "semiconductor body" to -- Schottky diode --.
Lines 61 and 65, change "semiconductor body" to -- Schottky diode --.

Column 5,
Lines 1 and 4, change "semiconductor body" to -- Schottky diode --.
Line 7, change "semiconductor body" to -- Schottky diode --.

Column 6,
Lines 5 and 7, change "semiconductor body" to -- Schottky diode --.
Lines 12 and 15, change "semiconductor body" to -- Schottky diode --.
Lines 18 and 21, change "semiconductor body" to -- Schottky diode --.

Signed and Sealed this

Fourteenth Day of January, 2003

JAMES E. ROGAN
*Director of the United States Patent and Trademark Office*